United States Patent
Colpo et al.

(10) Patent No.: US 6,682,630 B1
(45) Date of Patent: Jan. 27, 2004

(54) UNIFORM GAS DISTRIBUTION IN LARGE AREA PLASMA SOURCE

(75) Inventors: Pascal Colpo, Annecy (FR); François Rossi, Andronno (IT)

(73) Assignee: European Community (EC) (LU)

( * ) Notice: Subject to any disclaimer, the term of this patent is extended or adjusted under 35 U.S.C. 154(b) by 0 days.

(21) Appl. No.: 10/088,512

(22) PCT Filed: Sep. 18, 2000

(86) PCT No.: PCT/EP00/09996

§ 371 (c)(1),
(2), (4) Date: Mar. 29, 2002

(87) PCT Pub. No.: WO01/24220

PCT Pub. Date: Apr. 5, 2001

(30) Foreign Application Priority Data

Sep. 29, 1999 (EP) ............................................. 99402374

(51) Int. Cl.[7] ........................... C23C 16/00; H01L 21/00
(52) U.S. Cl. .............................. 156/345.48; 156/345.49; 156/345.33; 118/723 I; 118/715
(58) Field of Search .................... 118/723 I, 723 IR, 118/723 AN, 715, 723 R, 723 E, 723 MR, 723 MA; 156/345.48, 345.49, 345.47, 345.33, 345.34, 345.42, 345.46; 204/298.07, 298.16, 298.33, 298.37; 315/111.51

(56) References Cited

U.S. PATENT DOCUMENTS

| | | | | |
|---|---|---|---|---|
| 5,500,256 A | * | 3/1996 | Watabe | 427/579 |
| 5,683,517 A | * | 11/1997 | Shan | 118/723 E |
| 5,685,914 A | * | 11/1997 | Hills et al. | 118/723 E |
| 5,885,356 A | * | 3/1999 | Zhao et al. | 118/723 ER |
| 6,041,733 A | * | 3/2000 | Kim et al. | 118/723 E |

FOREIGN PATENT DOCUMENTS

EP 0 908 923 A2 * 4/1999

* cited by examiner

Primary Examiner—Luz Alejandro-Mulero
(74) Attorney, Agent, or Firm—Bacon & Thomas, PLLC (57) ABSTRACT

An apparatus configured to generate a time-varying magnetic field through a field admission window of a plasma processing chamber to create or sustain a plasma within the chamber by inductive coupling. The apparatus includes a magnetic core presenting a pole face structure,—an inductor means associated with the magnetic core, arranged to generate a time-varying magnetic field through the pole face structure, and—a device for injecting gas into the chamber and through the chamber and through the magnetic core.

45 Claims, 7 Drawing Sheets

UNIFORM GAS DISTRIBUTION IN LARGE AREA PLASMA SOURCE

Technical Field and Related Art

The present invention relates generally to apparatus and their use for surface treatments using plasma assisted processing and more particularly, but not exclusively, for the treatment of large flat substrates.

Such treatments can include etching, deposition, cleaning, passivation and ion implantation.

The new requirements for the plasma processing of large substrates become more and more critical for plasma sources available on the market. The success of the plasma assisted processing depends on the scalability of these plasma sources.

To fulfill these requirements, new plasma sources must be envisaged to process large substrates with plasma features like the generation of high densities of reactive species with low and controllable energy over a wide pressure range, and with an excellent homogeneity throughout the substrate.

Plasma processing generally uses a vacuum chamber connected to a gas inlet and a pumping device for controlling the gas flows and pressure. Electrical energy is applied to the vacuum chamber to accelerate the free electrons in the gases to the energy of ionization of the gas molecules, which thereby creates plasma. Ionization phenomena free some electrons which can also be accelerated to the ionization energy.

The added energy of the free electrons in the gas is generally accomplished by an electric field, a varying magnetic field, or both.

One traditional method used in plasma processing to generate plasma is by a technique known as Capacitively Coupled Plasma. The plasma results from the application of an AC voltage between two electrodes creating an electric field which accelerate the free electrons. Generally, one of the two electrodes is the substrate holder. The applied energy generated by the AC voltage applied between the two electrodes controls at the same time the flux and kinetic energy of the ions. Because the two parameters are coupled, this process is difficult to optimize.

Another plasma source used in plasma processing is based on the Electron Cyclotron Resonance (ECR). In this process, microwave power is applied to the gas together with a constant magnetic field which transforms the electron paths into a circular path. The intensity of the magnetic field is such that the frequency of gyration of the electron is the same as the frequency of the electric field, which leads to a resonance effect increasing the efficiency of electron acceleration. This type of excitation mode can provide a plasma with high ion flux and low ion energy. The ion energy can be controlled by applying an independent bias to the substrate. However, such an apparatus is complex and expensive. Moreover, it is still too limited as regards the plasma expected processing expected features, in particular for scaling up and homogeneity of the plasma source.

A new generation of plasma source has been developed during the last years which give good promise. These are known as Inductively Coupled Plasmas (ICPs), such as described e.g. in U.S. Pat. Nos. 4,948,458 and 5,277,751. The plasma is created by a varying magnetic field generated by a spiral planar coil. The electrons are accelerated in a circular path parallel to the coil plane and the insulating window of the plasma chamber. This configuration provides a high density plasma with low kinetic energy, but has an inherent problem of homogeneity at the center and at the boundary of the coil when the size of the apparatus is increased. This problem limits the scability of the process.

U.S. Pat. No. 5,435,881 presents an apparatus for generating a suitably low pressure planar plasma. This apparatus comprises a two-by-two or a larger array of alternating magnetic poles (multipoles). The advantages cited in this patent are the possibility to generate a large plasma by adding more varying magnetic poles, therefore having very small area on non uniform plasma.

However, such a design creates a dependency between the spacing of the two-by-two magnetic poles and the excitation frequency as well as the in-use operation pressure. This spacing depends on the mean free path of the electrons which decreases when the pressure increases. Accordingly, when a high operating pressure is necessary for process requirements, the spacing between the two-by-two poles must be drastically decreased. This becomes critical from a technical point of view. The process also requires different multipole distributions for different process pressures, which decreases its flexibility and applicability to industrial applications.

In all these prior art apparatus, there is a problem of gas distribution uniformity in the chamber center. The gas distribution is usually made using a ring located in the side wall of the plasma chamber, which results in a lack of gas distribution uniformity at the chamber center. This non-uniformity is even more acute when the plasma chamber dimension increases. Moreover the gas distribution means are usually made of metallic material, which perturbs the magnetic field inside the chamber, and thus the plasma density.

Document EP-776 645 apparently discloses a plasma reactor or plasma chamber in which a uniform gas distribution is achieved across a wafer surface by injecting gas through a center gas feed silicon or semiconductor ceiling.

Figure 1:
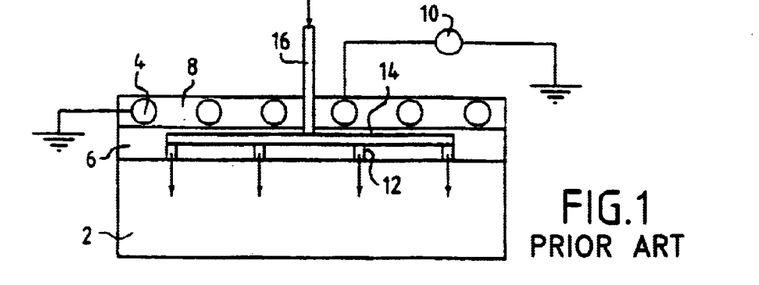
FIG. 1 is a schematic view of a plasma chamber according to the prior art.

This device is schematically illustrated on FIG. 1, and comprises a plasma chamber 2, covered by a semiconductor ceiling 6 through which gas injection tubes 12, 14 are drilled. Tube 14 in turn is connected to a center gas feed pipe 16.

An overhead inductive coil antenna 4 is held in an insulating antenna holder 8 connected to a plasma source power generator through an impedance match circuit 10.

In this device, a voltage of about 2000 to 3000 volts is usually applied to the coil antenna. A correspondingly very high electric field can thus be induced in the dielectric window constituted by the semiconductor ceiling 6. Such a capacitive coupling is very detrimental.

This document further suggests choosing either a dielectric or semiconductor, as a material for the top ceiling. However, dielectric or semiconductor material results in a plasma being created in tubes 12, 14, because of this capacitive coupling, which is gas consuming and can damage the semiconductor ceiling.

SUMMARY OF THE INVENTION

The invention concerns an apparatus for generating a time-varying magnetic field in a plasma processing chamber to create or sustain a plasma within the chamber by inductive coupling, characterised in that it comprises:
- a magnetic core presenting a pole face structure or a unipolar pole face structure
- an inductor means associated with the magnetic core, for generating a substantially uniformly distributed time-varying magnetic field throughout the pole face or unipolar pole face structure, means for injecting gas into said chamber and through said magnetic core.

Since the means for injecting gas into the plasma chamber are located or inserted through said magnetic core, a uniform or controlled gas distribution is achieved in a plasma processing chamber having such an apparatus for generating a time-varying magnetic field, without any perturbation of the magnetic field.

Furthermore, the magnetic core electrostatically isolates the means for gas injection from the inductor means. In other words, the magnetic core plays the role of an electrostatic screen between the means for gas injection and the inductor means, thus eliminating the risk of capacitive coupling. The risk of plasma induction in the gas injecting means themselves is reduced.

According to one embodiment of the invention, said means for injecting gas into said chamber form a showerhead-like gas injection.

For example, they advantageously comprise a plurality of injection pipes distributed through the magnetic core. These injection pipes are made of stainless steel material, or of an insulating material.

An advantage of this embodiment is that the number of injection pipes can be adapted without perturbing the magnetic field. In other words, the number of pipes does not influence the magnetic field inside the plasma chamber.

The diameter of the pipes can also be varied in a same magnetic core. More gas is injected through larger pipes, than through comparatively smaller pipes. It is thus possible to achieve a controlled gas injection in the plasma chamber.

The injection pipes are connected to gas distributing means for distributing gas to the injection pipes.

These gas distributing means are preferentially located on the side of the magnetic core opposite to an inner space of said plasma processing chamber In one embodiment, they comprise a common gas injection pipe, through which gas is distributed to the injection pipes. This common gas injection pipe is preferentially made of stainless steel, in particular in case of corrosive gases.

In another embodiment, the gas distributing means comprise a cover, located on the side of the magnetic core opposite to the inner space of the plasma processing chamber with a gap between said cover and said magnetic core, said injection pipes emerging in said gap.

A gas, or gases, is/are mixed in the gap between the cover and the magnetic core, thus increasing the homogeneity of the gas distributed or injected in the inner space of the plasma chamber. The gap thus forms a gas distribution area above the magnetic core.

Moreover, this arrangement avoids the connection of any gas distribution pipe (the above mentioned stainless steel common gas injection pipe) to the magnetic pole.

Preferably, the unipolar face structure is constituted by a single pole face of unitary construction. In this way, the plasma processing chamber is confronted with a substantially continuous surface, which further contributes to enhance uniformity.

It is nevertheless conceivable to divide the pole face structure into two or more pole faces or unipolar pole faces that confront respective portions of the plasma processing chamber. This alternative solution may be considered if the area to be covered by the magnetic core is particularly large. The pole faces may then be associated to respective inductors and power supplies whilst being kept in phase to ensure that all the pole faces have the same polarity at any one time.

The pole faces may alternatively physically depend from a common magnetic core and inductor.

In a preferred construction, the pole face structure constitutes an end face of the magnetic core.

Advantageously, the magnetic core comprises at least one electrical discontinuity in a path along a plane parallel to the pole face so as to prevent the circulation of eddy currents around the core. Indeed, the magnetic flux lines passing through the magnetic core tend to create eddy currents that circulate in the plane of the pole face, by Lenz's law. If these currents were free to circulate around the core, they would create magnetic flux lines that oppose those generated by the coil, with the effect of diminishing the net magnetic field energy emitted from the pole face, and of creating undesirable heating of the core.

The discontinuity can be in the form of one or more laminations. The lamination(s) preferably extend radially from a point proximal to or at the centre of the core to the to the periphery thereof. The laminations may occupy the entire depth of the magnetic core, as measured in the direction perpendicular to the pole face structure.

The above problem of eddy currents is more pronounced in some core designs than in others depending, for instance, on the core material used, and on the operation frequency, and it may not always be necessary to provide such a discontinuity.

The inductor means typically comprises a conductor arranged to form one or more turns around at least a portion of the magnetic core. It may be wound around the periphery of the magnetic core. The inductor means may also comprise a planar winding recessed within a groove pattern formed in the magnetic core, e.g. at the pole face surface.

The inductor means is driven by a power supply preferably delivering current at a frequency of around 10 kHz to 100 MHz, a typical operating frequency being 13.56 MHz. A circuit for impedance matching and phase factor correction can be provided between the power supply and the inductor if required.

The invention also concerns a plasma processing apparatus comprising:

a plasma processing chamber having at least one field admission opening or window at least one magnetic field generating apparatus as defined above, arranged to create a time-varying magnetic field in the chamber, power source means for driving the magnetic field generating apparatus.

A barrier can be formed between a field emission surface and the plasma environment in order to prevent that surface from contaminating the chamber.

Such a barrier comprises a sheet of dielectric material maintained between said pole face structure and an inner space of said plasma processing chamber.

Alternatively, the barrier comprises at least one field admission window between an inner space of said plasma chamber and said magnetic field generating apparatus. In this case, the means for injecting gas into the chamber and through said magnetic core traverse the window.

In this case, said magnetic core presents a unipolar face adapted to be applied against or in proximity to the window.

The magnetic core can easily be matched to the shape and dimensions of an opening or of a window of the plasma chamber; it can present e.g. a circular, rectangular or polygonal pole face as required.

A window of the processing chamber need not necessarily be flat, but may be curved, e.g. to follow the contour of a wall portion from which it/they depend(s). The magnetic core can likewise present a non planar pole face structure configured to follow the curvature of the window(s) to provide uniform conditions inside the chamber.

In the case of injection pipes, each of said injection pipes traverses said window through a corresponding hole in said window, and an end of each of said injection pipes is welded to the periphery of said corresponding hole.

The plasma processing chamber may comprise several field-admission windows. For example, it can be provided with two oppositely-facing windows. If the chamber has a shallow configuration (circular or square cross-section), the windows may be provided at each end of the shallow walls, for example. If the chamber has an elongate configuration (circular or square cross-section) the windows may be formed on the elongate walls, e.g. disposed in one or several pair(s) of oppositely-facing windows.

BRIEF DESCRIPTION OF THE DRAWINGS

The invention and its advantages will be better understood from the following description, given as non-limiting examples, of preferred embodiments with reference to the appended drawings, in which.

DETAILED DESCRIPTION OF PREFERRED EMBODIMENTS

Figure 2A:
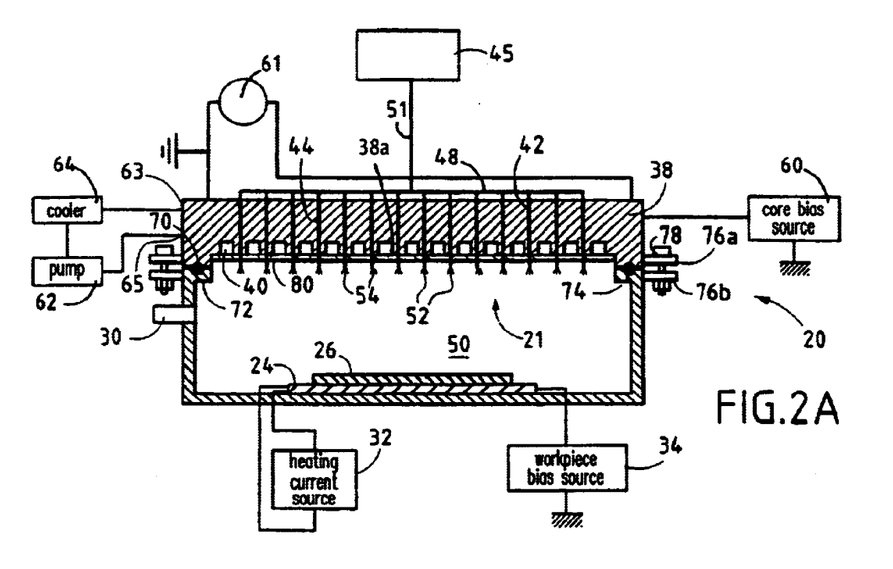
FIGS. 2A, 2B and 2C are detailed views of a magnetic core according to a first embodiment of the invention.

A first embodiment of the invention is illustrated on FIG. 2A, where the processing chamber 20 is in the form of a shallow cylindrical vessel in which a plasma is to be generated or sustained. In common with classical processing chambers, it comprises a support 24 for a workpiece 26, and at least one gas outlet port 30 for connection to a pumping device (not shown) to regulate the gas pressure inside the chamber.

The processing chamber 20 also comprises means for heating the workpiece 26 via the workpiece support 24. To this end, the latter is equipped with a heating resistance adapted to be in thermal contact with the workpiece 26 and powered by a controllable heating current source 32. The heating current source 32 operates in conjunction with a temperature sensor (not shown) responsive to the temperature of the workpiece to produce a constant set temperature or a predetermined time-dependent temperature variation according to requirements. Cooling means, not shown in FIG. 2A, can be used to cool working substrate 24. For example, a cooling fluid circulates through a fluid circulation conduit embedded in substrate 24 and connected to a pump and a cooler.

The processing chamber 20 also comprises means for biasing the workpiece 26, for example one or a number of electrical contacts (not shown) at the level of the workpiece support 26 which connect with workpiece either through cable connections or by direct physical contact. The contacts are supplied by a bias source 34 outside the chamber 20 which can be set to provide an ac bias (including radio frequencies), a dc bias or a ground bias.

The apparatus further comprises an inductive field energy field source 38 as a time-varying magnetic field generator. The magnetic field is created by a magnetic core 38 in association with an inductor winding 40.

The magnetic core has a pole face 38a which faces the inner space 50 of the plasma chamber. Inductor winding 40 can be constructed according to different variants, one of which is illustrated on FIGS. 2A–2C; others will be explained in relation to FIG. 3A–3C.

The magnetic core 38 is connected to a core bias source 60.

The core 38 can be biased to produce a predetermined potential at the level of the pole face 38a by means of a separate bias source 61 connected thereto. The bias source can be set to provide an ac bias (including radio frequencies), a dc bias or to ground the core 38.

The combination of a magnetic core with the inductor serves to increase and homogenize the magnetic field produced by the inductor, the magnetic flux lines being uniformly distributed over the pole face structure. This effect is particularly pronounced given that a typical core material that can be used (like soft iron, or an iron alloy or a ferrogmagnetic material) possesses a very high permeability ($\mu$) e.g. in the region of 1000 or more.

The combination of the magnetic core and pole face structure reduces the magnetic field "dead area" at the center of the inductor, compared to magnetic field energy sources based on just an inductor having a spiral path formed parallel to the plane of the chamber opening 21.

As a result, it is possible to employ plasma processing chambers having large opening areas and thereby to process correspondingly large workpieces under homogeneous plasma conditions throughout the active area. For instance, this type of apparatus can be used for processing substrates of flat panel displays such as LCDs having dimensions of around 0.5 m square or more.

Figure 2B:
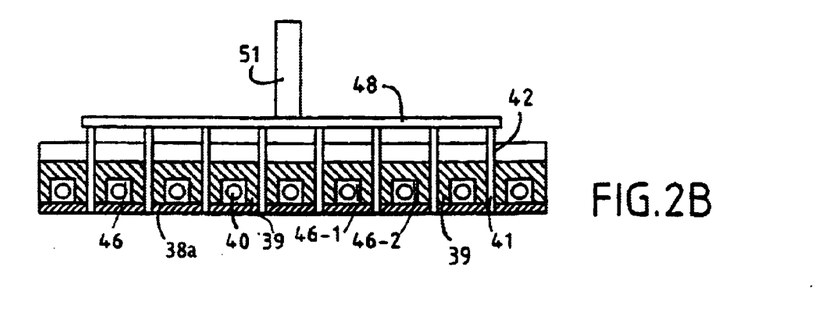
Figure 2C:
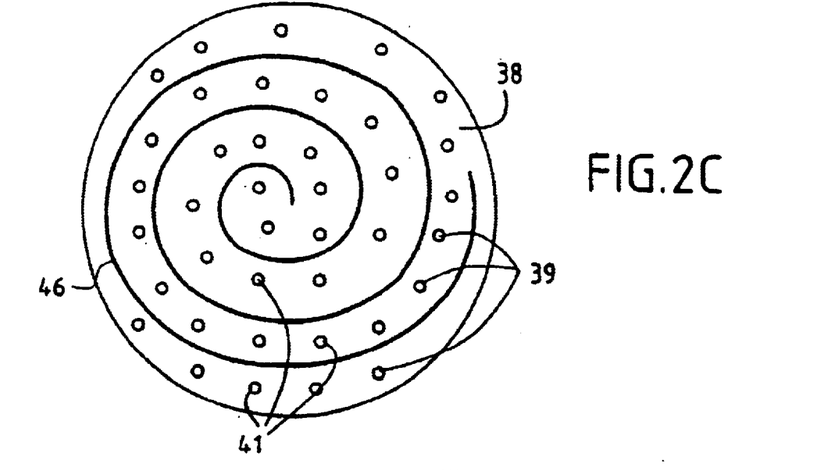

Injection tubes or pipes 42, 44 traverse the magnetic core through holes 39, 41 bored or drilled through said magnetic core as illustrated on FIGS. 2B and 2C. As illustrated in FIG. 2B, the tubes are preferentially perpendicular to pole face 38a or to a plane defined by the magnetic core itself.

The injection tubes pass between the notches 46 in which coil or winding 40 is inserted. Gas distributing means 48 for distributing gas to the injection pipes are located on the side of the magnetic core opposite to an inner space 50 of the plasma processing chamber. In the illustrated embodiment, said gas distributing means comprise common gas injection pipes 48, 51 through which gas is distributed to the various injection pipes 42, 44. Pipe 51 is in turn connected to gas feeding means 45, including gas containers, pumping means, and their connecting means to pipe 51.

Injection pipes 42, 44 are made of stainless steel or of an insulating material (for example: ceramic alumina). Pipes 48, 51 are made of stainless steel.

When gas is injected through pipes 51, 48, 44 and 42, it is sprayed in gas jets 52, 54 into the inner space 50, thus forming a showerhead-like gas injection. This results in an homogenous gas atmosphere inside this inner space and in particular over workpiece 26.

In FIGS. 2A and 2B, pipes 42, 44 are schematically represented as having the same diameter. However, they can also have different diameters through a same magnetic core, facilitating the gas flow control through this core. More gas is injected in regions where pipes have a larger diameter than in regions where they have a comparatively smaller diameter.

The magnetic core 38 can be made of any ferromagnetic material that can be engineered to the required structural specification or of a magnetic ceramic such as ferrite.

Where a relatively high field frequency is envisaged (e.g. 30 k Hz to 5 MHz and more), the core can be made from a material composed of a magnetic powder and dielectric binder such as sold under the name of "Fluxtrol F" (RTM), from Fluxtrol Manufacturing, Inc. of Troy, Mich., USA. or any other similar material. Such a material has the advantage of providing excellent field uniformity in combination with minimum eddy current losses, without recourse to using a laminated structure.

In the embodiment of FIG. 2A, the magnetic core 38—and hence its pole face 38a—are actively cooled by a closed circuit refrigerating system. The latter comprises a fluid circulation conduit (not shown on FIGS. 2A and 2B) embedded in the core 38 and connected via an outlet 65 and an inlet 63 to a pump 62 and a cooler 64.

In the construction shown in FIG. 2B a groove pattern 46 is formed in the magnetic core 38 to receive the inductor winding 40. In the example, the grooves 46 are exposed on the pole face 38a that confronts the inner space of the processing chamber 20 and are present substantially throughout that face. The pattern can form a spiral or concentric closed path following a contour of the magnetic core. The inductor winding 40 is arranged to be completely recessed in the grooves 46, these being sufficiently deep to accommodate one or more stacked winding layers. The inductor 40 has for example a circular or a square cross-section.

Protrusions 39 situated between adjacent or neighbouring notches 46-1 and 46-2 are larger than the diameter of an injection tube 42 passing therethrough. Thus, these protrusions form an electrostatic shield between tube 42 and winding 40, eliminating any coupling between tube and winding.

FIG. 2C is a bottom view of the magnetic core 38, with grooves 46 forming a spiral path and holes 39, 41 all bored or drilled in or through the magnetic core 38.

Figure 3A:
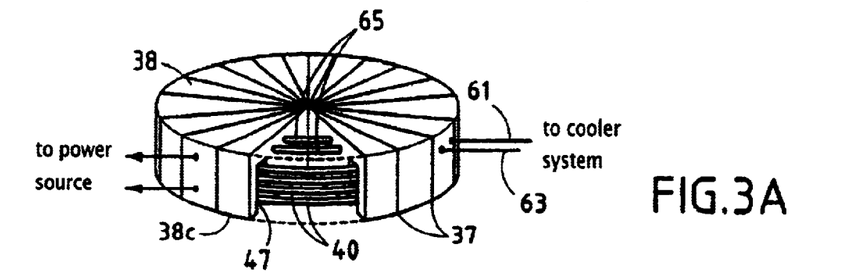
FIGS. 3A to 3C are schematic views of other time-varying magnetic field generators which can be used in a plasma generating chamber of the invention.

According to a variant shown on FIG. 3A, inductor 40 comprises a metal tube wound as a coil having one or a number of turns (typically three to ten) of equal radii, concentric with the core 38 and close to the periphery of the latter. The tube can e.g. be made of copper or silver-plated copper and typically has a cross-section of around 5 to 25 mm, possibly more. In the example, the inductor winding is recessed within a groove 47 in the material of the magnetic core 38.

This variant offers the following further advantage. If the core is made from a material susceptible of eddy current losses, the latter can be eliminated when relatively low frequencies are used by employing the laminated core structure of FIG. 3A. Laminations 37 of insulating material divide the core 38 into electrically isolating segments radiating from a central portion so as to prevent the circulation of eddy currents. Alternatively, the segments 38c can be separated by an air gap.

Figure 3B:
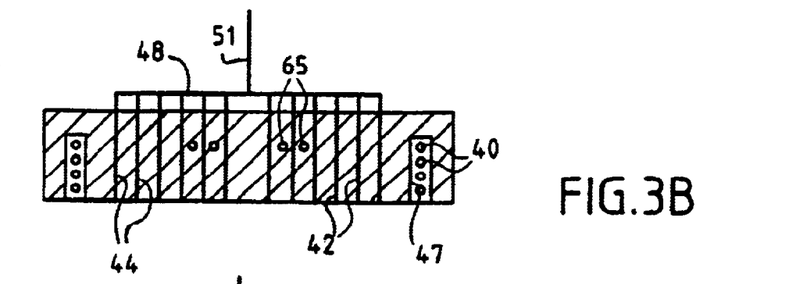

In the variant of FIG. 3A and 3B fluid circulation conduit 65 of the refrigerating system can comprise a few turns of piping around the magnetic core. For improved heat dissipation, the piping can be associated with fins or equivalent structures embedded in the core.

FIG. 3B is a cross-sectional view of the structure of FIG. 3A. It clearly shows the gas injection pipes 42, 44, 48, 51, pipes 42 and 44 traversing the magnetic core 38. The last one plays here also the role of electrostatic screen between pipes 42, 44 and inductor means or winding 40, eliminating any coupling between said pipes and said winding.

Figure 3C:
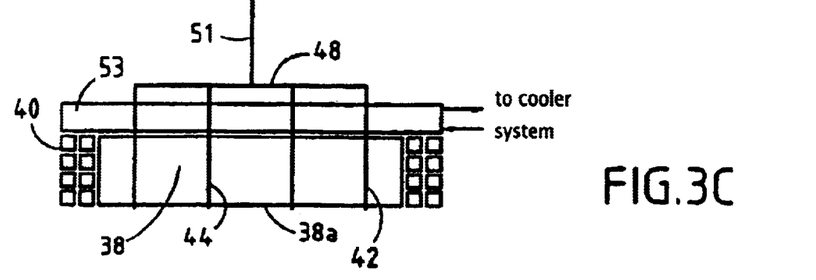

FIG. 3C is a cross-sectional view of another variant of magnetic core structure which can be used according to the invention. The conductor winding 40 is formed around the periphery of the magnetic core 38. In this example, the conductor has a square section and forms two winding layers. This figure also clearly shows gas injection pipes 42, 44, 48, pipes 42 and 44 traversing the magnetic core 38, the electrostatic screen between pipes 42, 44 and inductor means or winding 40. This screen eliminates, as in the other embodiments and variants explained above, any electrostatic coupling between said pipes and said winding.

In any of the above embodiments and variants, the number of turns forming the inductor is determined, inter alia, by the impedance matching with the power source 61.

The power source 61 is of a classical design, comprising a radio-frequency (RF) generator whose power output is connected to the coil 40 via a tuned circuit (not shown) having a capacitive element for impedance and phase factor matching to the load. Typically the generator 61 operates at a frequency of 13.56 MHz, but this value can be e.g. from a few tens of kHz to several tens of MHz depending on the specifics of the design.

The current from the high-frequency power source 61 circulates around the coil 40 and generates a magnetic field whose flux lines are substantially perpendicular to the plane of the coil, at the region within the coil, and hence perpendicular to surface 38a. The flux lines alternate at each cycle of the high-frequency current flowing in the coil and create a magnetization of the core, and hence perpendicular to surface 38a. The flux lines alternate at each cycle of the high-frequency current flowing in the coil and create a magnetization of the core 38 with a polarity that likewise alternates at each cycle. The unipolar pole face 38a of the magnetic core is thus magnetized in alternation between north and south polarities but, at any one moment, possesses the same polarity throughout its area, and is in this respect considered as a unipolar pole face. The high permeability of the core material ensures that the magnetic field lines from the unipolar pole face 38a are of uniform density. The space 50 inside the plasma processing chamber 20,—and hence the workpiece 26,—experiences a correspondingly uniform plasma environment.

In the variants of FIGS. 2B and 3C, the magnetic core 38 can present a break in the electrical path for eliminating eddy currents, or no such break.

Also, the core cooling system in these variants comprises a cooling plate 53 placed in thermal contact with the top surface of the core 38 and inductor winding 40 (i.e. the surface opposite the pole face 38a). The cooling plate 53 comprises a conduit connected to a cooling system as described in FIG. 2A and can be traversed by injection pipes 42, 44.

This cooling plate can alternatively—or additionally—comprise a heat-sink structure adapted to radiate heat. The heat-sink structure can in this case be associated with a force-air flow.

Also, in any of the above embodiments and their variants, the inductor 40 can have a cross-section other than square, e.g. circular. Furthermore, the geometry of the plasma processing chamber 20,—and hence the magnetic core,—is cylindrical. However, the same concepts can be readily transposed to other geometries (square, oblong, oval or polygonal) by simple adaptation.

The field energy source also forms a sealed cover with respect to the inner space 50 of the plasma chamber. Sealing means are disposed between the periphery of the plasma chamber and the magnetic core.

In the above illustrated embodiment and its variants, the periphery of the magnetic core 38 defines a shoulder portion 70 that rests on a corresponding rim portion 72 around the opening of the process chamber via a sealing gasket 74.

Respective flanges 76a, 76b project outwardly from the shoulder 70 and the rim portion 72 to hold and tighten the magnetic core 38 against the process chamber 20 by nut-and-bolt fasteners 78 to ensure a proper seal by the gasket 74. The magnetic core 38 is electrically isolated from the mechanical structure forming the chamber 20 so that it can be biased by the bias source 61 independently of the chamber. In the example, the electrical isolation is effected by the sealing gasket 74. More generally, the sealing means mentioned above are also used as means for electrically isolating the magnetic core form the plasma chamber.

A dielectric material sheet 80 e.g. of quartz, glass such as Pyrex (RTM) a ceramic or polymer can be provided between the pole face 38a and the space inside the chamber 20 to prevent possible contamination of the plasma gas by the pole face material. In the example of FIG. 2A, the sheet 80 is applied against the pole face 38a and held by the latter, e.g. by adapted mounting brackets.

Figure 4:
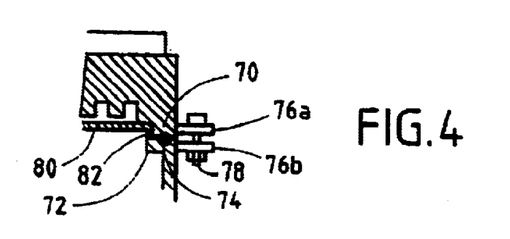
FIG. 4 is a detailed view of the plasma processing apparatus shown in FIG. 2A.

Alternatively, the sheet of dielectric material 80 may be maintained without contacting the pole face 38a, e.g. by means of a peripheral mounting recess 82 formed at the shoulder portion 70 of the magnetic core 38, as shown in FIG. 4.

In this case, means may be provided to equalize the pressures respectively at the space between the outer face of the sheet 80 and the pole face 38a and at the space between the inner surface of the sheet and the inner walls of the chamber 20. Such means can be in the form of a simple opening or group of opening, or a valve arrangement, e.g. at an edge of the sheet.

If a valve is used, means may be provided to control the latter such that a pressure equalization can take place whilst the chamber is being prepared e.g. during gas exhaustion and establishing the process gas conditions, but closed when a plasma process is being performed so as to prevent any contaminant from the energy field source reaching the process gas. conditions, but closed when a plasma process is being performed, so as to prevent any contaminant from the energy field source reaching the process gas.

The dielectric sheet 80 experiences the same pressure on both of its sides and needs not therefore be rigid to the extent required for a window that has to withstand atmospheric pressure. In this case, the force of atmospheric pressure is supported by the magnetic core 38, which is normally sufficiently rigid for that purpose. If needs be, the core can be strengthened to ensure that it does not distort significantly when submitted to a pressure differential of one atmosphere.

Depending on operating conditions, it may be necessary to take appropriate measures to avoid a plasma being formed in the space between the dielectric sheet 80 and the pole face 38a. One solution is to ensure that the gap between the dielectric sheet and the pole face is kept as small as possible, e.g. less than 1 mm, possibly less than 0.5 mm.

Holes are made in sheet 80 to let tubes or pipes 42, 44 traverse or go through, so that they can inject gas into inner space 50. The end of tubes 42, 44 are welded to sheet 80.

Figure 5:
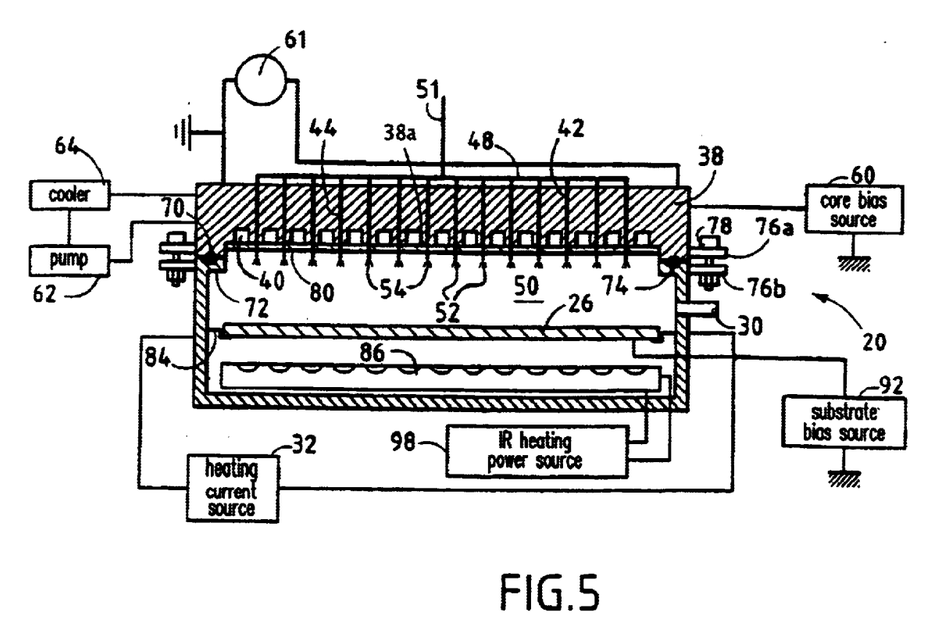
FIG. 5 is a schematic cross-sectional view of a plasma processing apparatus according to another embodiment of the invention.

FIG. 5 illustrates a further embodiment where the workpiece 26 is held suspended by a support structure 84. The workpiece 26 is heated by an infrared heating device 86 beneath the workpiece and connected to an infrared heating power source 98.

Substrate is biased with a substrate bias source 92.

Other reference numbers designate the same features as on FIG. 2A.

In the embodiments described above, the plasma chamber has one energy field admission opening.

Figure 6:
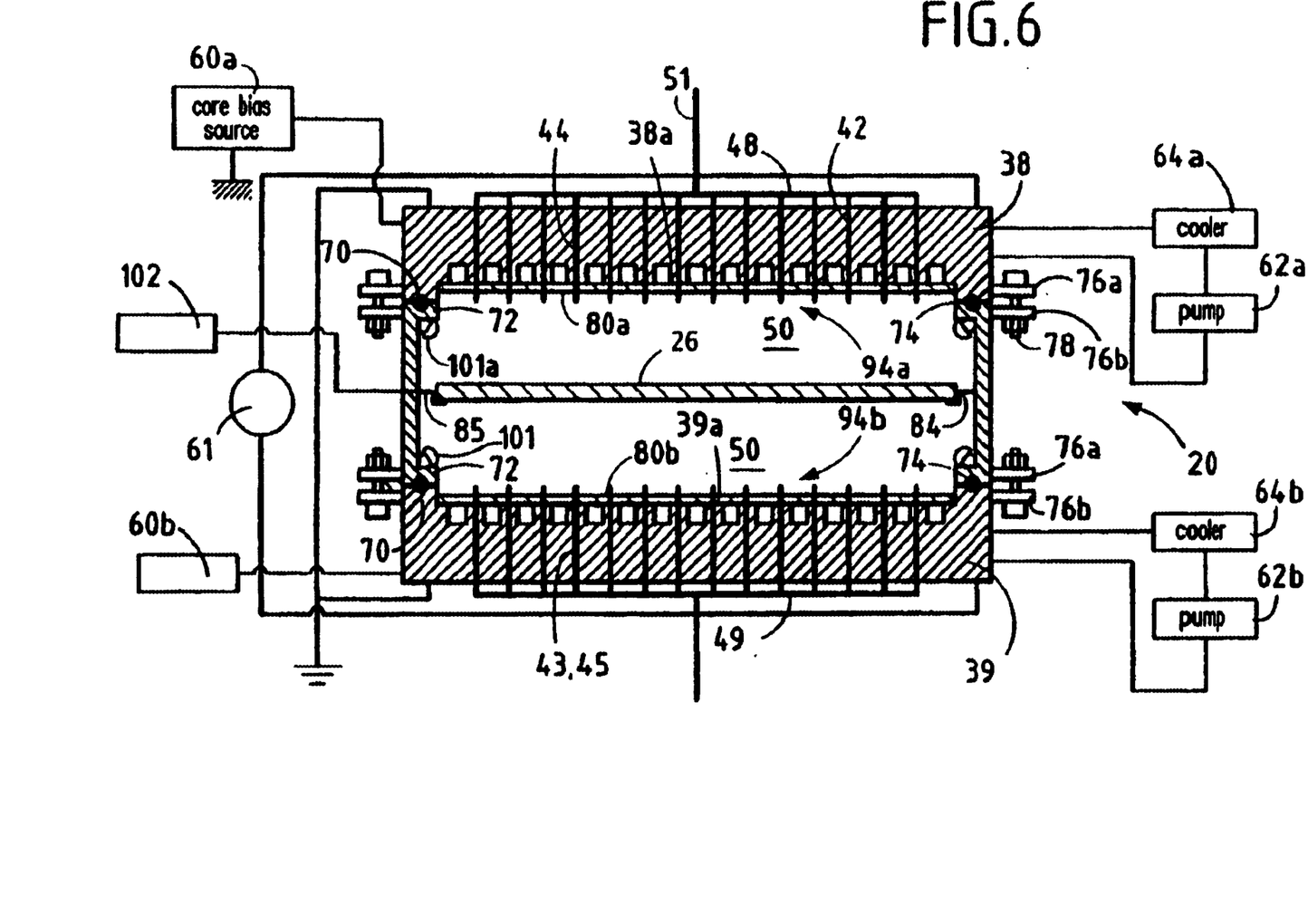
FIG. 6 is a schematic cross-sectional view of a plasma processing apparatus according to a further embodiment of the invention.

FIG. 6 is a partial plan view of another embodiment which is analogous to the above embodiments, but where the process chamber has more than one (two in the illustrated example) energy field admission openings.

Each opening is disposed so as to allow exposure of different portions of a workpiece 26 to the plasma generating or enhancing effect of the energy field.

In the example of FIG. 6, the plasma processing chamber 20 has the basic configuration shown in FIG. 2A.

Two openings 94a and 94b are provided, one at each respective end face of the chamber 20, each opening 94a, 94b being associated with an inductive energy source for creating a plasma condition inside the chamber. In the example, the inductive energy source is a time-varying magnetic field generator as in the previous embodiments. Each inductive energy source is traversed by corresponding tube or pipe 42, 44, 43, 45 for gas injection. Gas distributing means 48, 49 for distributing gas to the injection pipes are located on the side of each magnetic core opposite to an inner space 50 of the plasma processing chamber. In the illustrated embodiment, said gas distributing means comprise a common gas injection pipe 48, 49 through which gas is distributed to the various injection pipes 42, 44, 43, 45.

The openings 94a, 94b, time-varying magnetic field generators 38, 39 and mutual disposition between the opening and the generator, core biasing means 60a, 60b and core cooling means 62a, 62b, 64a, 64b, are in every respect identical to what has been described in respect of the first embodiment and its variants, and shall therefore not be repeated for conciseness. It can be noted that while the illustrated example provides separate core biasing means 60a, 60b for each time-varying magnetic field generator and separate cooling systems 62a, b, 64a, b, other arrangements can be envisaged.

Also, the magnetic core variants illustrated on FIGS. 3A, 3B and 3C are applicable to this embodiment.

The workpiece 26 has upper and lower faces that occupy virtually the entire projected area of the respective openings 94a, 94b . It is held suspended by a support structure 84, mid-way between the two windows, such as to allow each of the upper and lower surfaces to be exposed directly to its respective opening. In this way, it is possible to treat both faces of the workpiece 26 simultaneously and under the same optimal conditions with regard to plasma energy generating field induced from the opening. It is also possible to process one face of two workpieces placed back-to-back.

The support structure 84 is designed to produce no shadowing of the field energy from either of the two opening 94a, 94b. In the example, the support structure 84 depends from inner wall portions of the chamber 20, mid-way between the two end faces. The innermost part of the support structure 84 is equipped with an edge grip or edge rest 85 for the workpiece 26.

In order to ensure an improved homogenous gas flow conditions at each exposed face of the workpiece, separate gas outlets can be provided respectively at the upper and lower portions of the processing chamber 20.

The upper and lower portions can be open to communicate with each other to allow a uniform mixing of gases.

Alternatively, they can be separated by a sealed partition adapted to surround around the workpiece 26 in a gas-tight manner so that separate gas conditions can be established on respective faces of the workpiece 26. To this end, the workpiece support structure 84 can form a part of the partition in conjunction with the workpiece 26. Edge grips or edge rests 85 can in this case be made to surround the entire periphery of the workpiece 26 and be provided with a gas tight seal at the interface with the edge of the workpiece. The support structure 84 is likewise sealed around the entire periphery of the internal walls of the chamber 20.

As in the first embodiment, means are provided for heating and biasing the workpiece at the level of the support structure 84. In this case, however, heating of the workpiece 26 is effected by means of heating lamps 101, 101a disposed at corners of the chamber 20 so as not to obstruct the field of view from the openings 94a, 94b or otherwise cause shadowing of the energy field. The lamps 101, 101a have a transmission optics or reflector to produce a uniform distribution of heat onto the workpiece 26. Both faces of the workpiece 26 can be heated simultaneously. The electrical connections to the lamps 101 are not shown in the figure.

The workpiece biasing means comprise one or a set of electrical contacts provided on the support structure 84 so as to interface with the workpiece, e.g. at the level of the edge grips 85. The contact(s) are connected to a bias source 102 that can produce either an ac bias (include radio frequencies), a dc bias or a ground bias.

The above-described arrangement of the workpiece heating and biasing means does not interfere with the passage of the energy field to the faces of the workpiece from the respective opposite openings 94a, 94b.

The respective inductors of the time-varying magnetic field generators 38, 39 can be connected in parallel to a common power source 61 (as shown in FIG. 6) or in series, with an impedance and phase factor matching circuit adapted as required. Alternatively, they may each be connected to a separate power source.

In each side of the chamber 20 a dielectric material sheet 80a, 80b can be provided between the corresponding pole face 38a, 39a and the inner space of the chamber. Such a sheet is of the same composition and has the same purpose as already described above.

Figure 7:
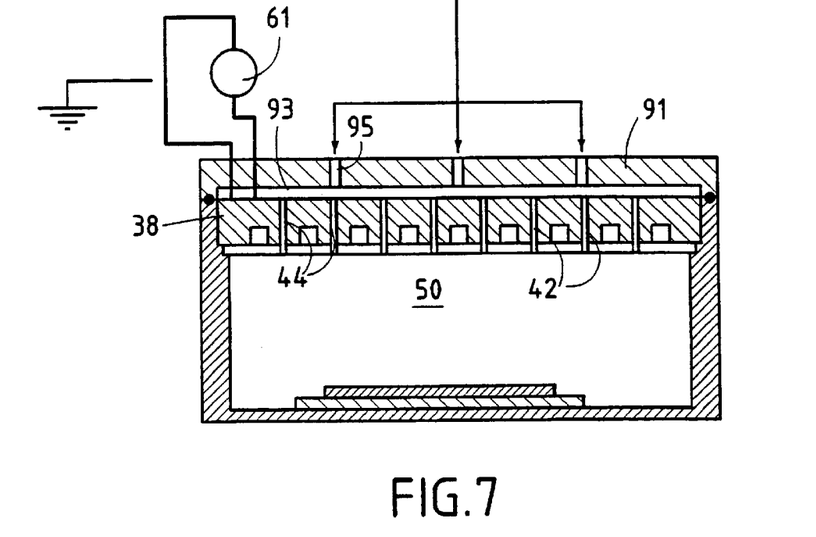
FIG. 7 is a schematic cross-sectional view of a plasma processing apparatus according to a further embodiment of the invention, with a cover and a gap for gas distribution.

FIG. 7 is another embodiment of the invention. The magnetic core and the plasma chamber are identical to those of the first embodiments and its variants. In addition it comprises a cover 91 situated above the magnetic core 38. The bottom surface of the cover is situated at a certain distance from the upper or top surface of the magnetic core, thus defining a gap 93 there between. Holes 95 are bored or drilled through cover 91, which can be made of stainless steel or aluminium or any insulating material. It can be made of the same material as pipes 42, 44 or as pipes 48, 51 (FIG. 2B), which facilitates welding of said pipes with cover 91.

Injection pipes 42, 44 are provided through the magnetic core 38 as already described above. Each of these injection pipes has one end opening to the inner space 50 and its other end opening to gap 93. Like in the first embodiment, gas distributing means for distributing gas to the injection pipes 42, 44 are located on the side of the magnetic core 38 opposite to the inner space 50 of the plasma processing chamber. However, in the embodiment of FIG. 7, the gas distributing means are formed of, or comprise the gap 93 and the holes 95. Gas is first injected in the gap 93 through holes 95. Injected gas is mixed in gap or mixing chamber 93 and is then injected towards the inner space 50 of plasma chamber 20 through pipes 42, 44.

In this embodiment, gas injection is performed roughly in two steps. In a first step, gas is injected into gap 93 and is mixed therein. It is also equally distributed over the various open ends of pipes 42, 44. In a second step, mixed gas is injected to inner space 50 through pipes 42, 44. Actually part of the gas is injected into pipes 42, 44 while the rest of the gas is still in gap 93.

The structure of plasma gas chamber of FIG. 7, and in particular the two-step gas injection, enhances gas mixing which is particularly advantageous when using gas mixtures. It also enhances gas homogeneity since a first homogenisation occurs in gap 93.

The embodiment of FIG. 7 is compatible with the structure of FIG. 6, two covers with a gap between each of them and the corresponding magnetic core replacing distribution pipes 48, 51, with the same advantages as explained above in relation to FIG. 6.

Figure 8:
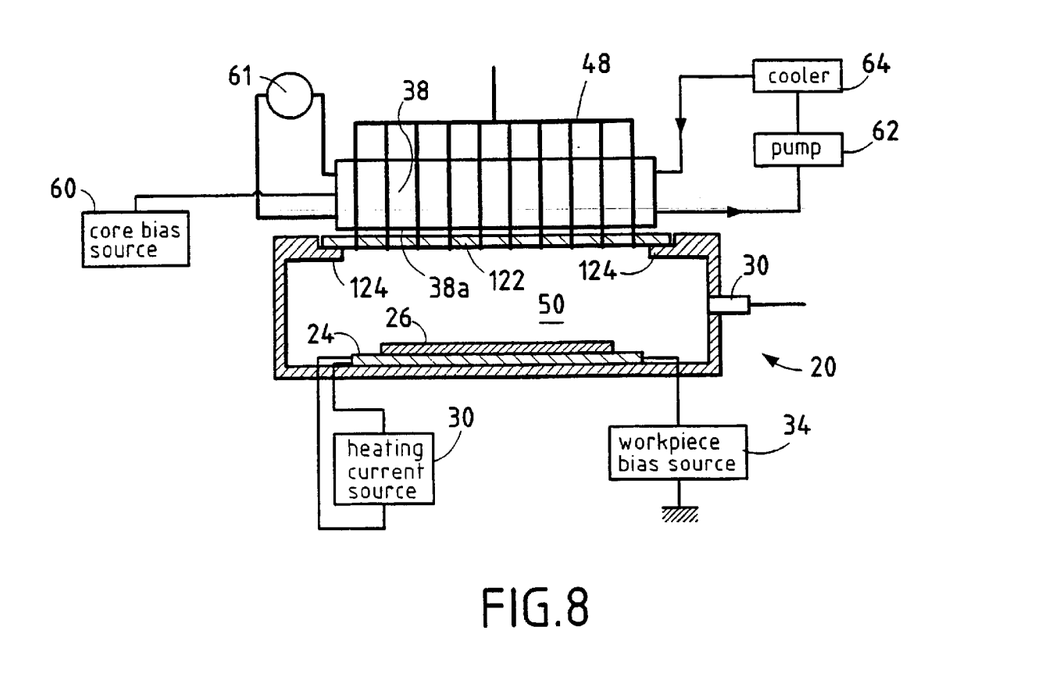
FIGS. 8 and 9 are cross-sectional views of another embodiment of the invention, with windows sealing the plasma chamber.

FIG. 8 illustrates another embodiment of the invention. Reference numbers identical to those of FIG. 2A designate elements or features which are the same or correspond to those of FIG. 2A. In addition, a top face of the chamber is provided with a window 122 which is made of quartz or other dielectric material such as to allow an energy field to enter inside the chamber by inductive coupling and thereby create or sustain the required plasma processing conditions. The window 122 is maintained on a rim portion 124 of the chamber 20 through a gas-tight seal. The rigidity of the window 122 and quality of the seal must be such as to withstand the collapsing force of atmospheric pressure when low pressure gas or partial vacuum conditions exist inside the chamber.

Window 122 forms a barrier between inner space 50 and surface 38a, preventing the last one from contaminating the chamber.

The size of the window 122 determines the area over which the plasma conditions are generated or sustained inside the chamber 20, and consequently the area of the workpiece 26 that can be processed under optimum conditions. In the example, the window 122 occupies almost the entire cross-section of the chamber, enabling the workpiece 26 to occupy a correspondingly large area.

The field energy generator 38 induces a time-varying magnetic field inside the chamber 20 through the window 122. It is provided outside the chamber 20 and against the window, slightly spaced from the latter.

The magnetic field is created by a magnetic core 38 in association with an inductor winding 40, having a structure as illustrated for example on FIGS. 2B, 2C, 3A, 3B or 3C. Winding 40 circulates a current from a high-frequency electrical power source 61.

The magnetic core 38 is connected to a core bias source 60.

The magnetic core 38 presents a face 38a having substantially the same size and shape as the window 122 and positioned in alignment with the latter. To ensure minimum energy loss, the distance between the unipolar pole face 38a and the window 122 is kept small (a few mm) or even zero.

The inductive energy source is traversed by tubes or pipes 42, 44 for gas injection. Gas distributing means 48 for distributing gas to the injection pipes are located on the side of each magnetic core opposite to an inner space 50 of the plasma processing chamber. As in the above embodiments, the magnetic core of the inductive energy source forms an electrostatic screen between pipes 42, 44 and inductor means or winding 40. This screen eliminates, as in the other embodiments and variants explained above, any coupling between said pipes and said winding.

Figure 9:
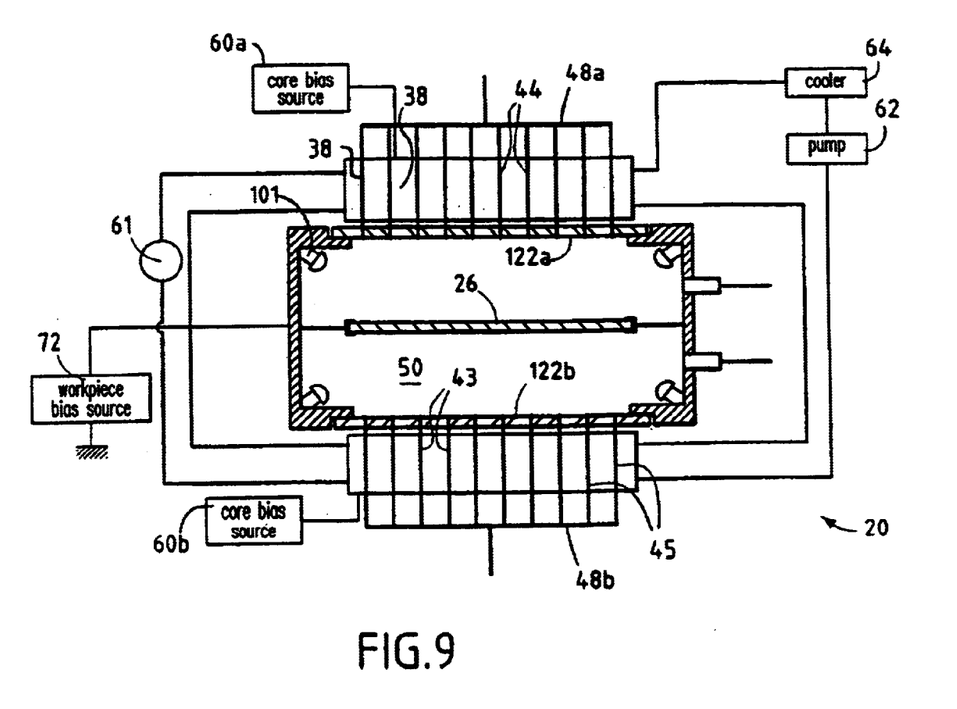

FIG. 9 is a partial plan view of another embodiment, where the process chamber has more than one window, for example two windows, for admitting field energy, in conformity with another aspect of the present invention.

Each window is disposed so as to allow exposure of different portions of a workpiece 26 to the plasma generating or enhancing effect of the energy field.

In the example of FIG. 9, the plasma processing chamber 20 has the basic configuration shown in FIG. 8, except for the two windows 122a, 122b provided, one at each respective end face of the chamber 20.

To each window 122a, 122b is associated an inductive energy source for creating a plasma condition inside the chamber. The inductive energy source is a time-varying magnetic field generator as in the previous embodiments, for example as illustrated on any pf FIGS. 2B, 2C, 3A, 3B or 3C. Each inductive energy source is traversed by corresponding tubes or pipes 42, 44, 43, 45 for gas injection. Gas distributing means 48a, 48b for distributing gas to the injection pipes are located on the side of each magnetic core opposite to an inner space 50 of the plasma processing chamber The workpiece 26 is connected to the workpiece bias source 72.

In both variants of FIGS. 8 and 9, the injection pipes traverses holes arranged in window 122, 122a, 122b and the periphery of one end of each pipe is welded to the periphery of the corresponding hole in window 122, 122a, or 122b.

Both embodiments of FIGS. 8 and 9 are represented with gas injection means formed of gas injection pipes 48a, 48b. However, gas distribution means can instead comprise cover means situated on each outer side of magnetic core 38 and 38a, forming a gap with said core, as explained above in relation with FIG. 7. Such gas distribution means have the advantages already disclosed above, namely improved mixing and homogeneity of the injected gas.

For the rest this embodiment is identical to what was described above in relation with FIGS. 6 and 8.

Figure 10A:
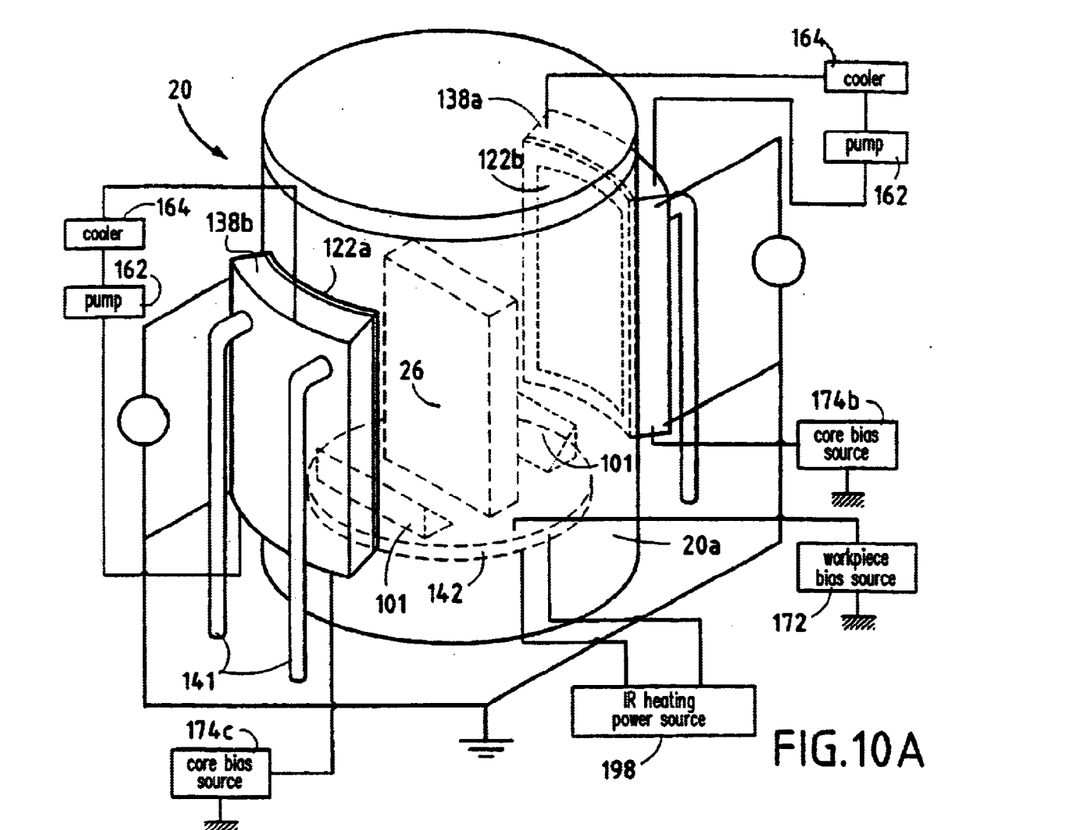
FIGS. 10A and 10B are a schematic general view and a detailed view of a plasma processing apparatus according to another embodiment of the invention.

FIG. 10A shows a third embodiment of the invention adapted to a plasma processing chamber 20 having a cylindrical shape in which the field energy is delivered through the side wall 20a of the chamber. In the example, two field-admission windows 122a, 122b are formed at corresponding openings in the side wall 20a at diametrically opposite positions. The windows 122a, 122b are made of dielectric material such as quartz and provide a pressure-tight seal for the openings. Each window gives direct access to a different surface portion of a workpiece which, in the example, is held inside the chamber by means of a stage 142 arranged to produce no shadowing effect for the energy field from each of the two windows.

Figure 10B:
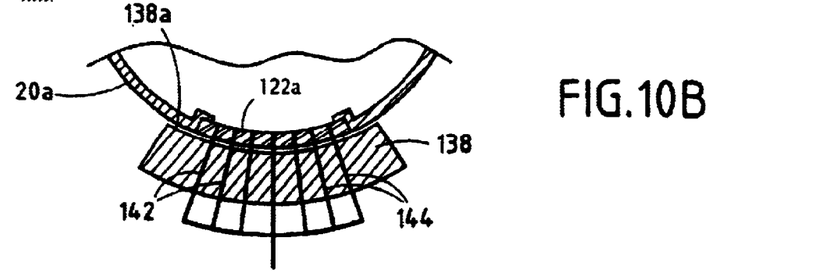

The field energy is provided by a time-varying magnetic generating apparatus 138a, 138b according to the first embodiment of FIG. 2B or 2C or its variants illustrated on FIGS. 3A–3C, each apparatus being associated to a corresponding window 122a, 122b. However, the magnetic pole pieces are in this case rectangular cylindrical segments with the pole face 138a confronting the window curved concentrically with the principal axis of the cylindrical wall of the plasma chamber. The pole pieces 138 may be flush against their respective window or at a small distance from the latter (FIG. 10B). The weight of the pole pieces 138 is supported by a mounting structure 141 separate from plasma processing chamber 20.

As shown in FIG. 10A, each core 138 is cooled by independent cooling means 162, 164 based on the embodiment of FIG. 2A. Likewise, each core 138 is biased independently.

The workpiece 26 is biased by one or a set of contacts (not shown) on the stage 142 connected to a workpiece bias source 172 providing the same functions as in the above-described embodiments.

Heating of the workpiece 26 is effected by a bank of infrared lamps 101 mounted on the stage 142 and connected to a heating power source 198 to form a classical infrared heater. Additional infrared heating lamps can be provided inside the chamber 20 at locations where they do not obstruct the energy field reaching the workpiece 26 from the different windows 122a, 122b.

Although the figure shows the chamber to have two energy field admission windows 122a, 122b, it is clear that more windows can be provided in the same manner if required. For instance, the chamber 20 can be provided with four, equally spaced windows e.g. for processing four faces at right angles of a workpiece or one face of four workpieces.

According to the invention, gas injection pipes traverse magnetic cores 138a, 138b. These pipes 142, 144 are not represented on FIG. 10A but are shown on FIG. 10B. They have the same purpose as in the other embodiments and are separated from the winding, which are used in combination with core 138 to create the magnetic field inside plasma chamber 20, by the electrostatic screen formed by the core itself.

Figure 11:
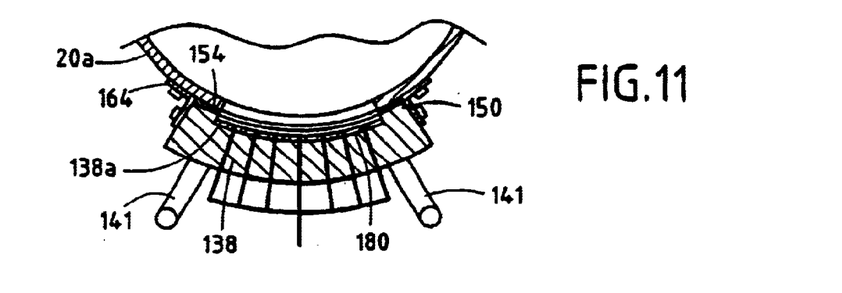
FIG. 11 is a detailed view of a variant of the last embodiment of the invention.

FIG. 11 is a partial plan view of another embodiment in which the plasma processing apparatus of FIG. 10A is modified by having the openings closed off and sealed by the field energy source, as in the embodiments of FIGS. 2A or 5 or 7.

In the figure, the magnetic core 138 has a peripheral shoulder portion 150 that presents a contact face adapted to fit against the portion of the chamber wall 20a around the opening via a gasket 154 to offer a gas-tight seal. The magnetic core 138 and gasket 154 are fixed onto the chamber wall by a peripheral mount 164. The weight of the magnetic core 138 is additionally supported by the independent support structures 141 shown in FIG. 10A.

In the example, a dielectric sheet 180 is conformed to the curvature of the pole face 138a and is supported by the latter.

It may alternatively be maintained spaced from the pole face e.g. by a peripheral recess similar to the one shown in FIG. 4. This dielectric sheet has the same purpose as sheet 80 on FIGS. 2A and 4, 5, or 6.

The embodiments of FIGS. 10A, B or 11 can also use a gas distribution system as disclosed above in relation with FIG. 7. In this case, a cover is situated on the outer side of each magnetic core 138a, 138b, said cover forming a gap with core 138a, 138b for gas mixing and homogenisation before injection into plasma chamber.

The cores 138a, 138b are connected to core bias sources 174b, 174c, respectively.

In all the above embodiments, the magnetic core and the winding extend over a surface which is approximately as large as the whole plasma chamber itself, with the advantage of allowing treatment and processing of large surfaces.

The invention applies as well to plasma chambers where the magnetic core and the winding are not as large as the plasma chamber itself. The plasma chamber then has the same characteristics as illustrated on any of FIGS. 2A–11, but with a winding not extending on the whole surface of the magnetic core.

The invention also concerns a plasma processing chamber as disclosed above, the magnetic core or its unipolar pole face structure having an active field emission area whose size and shape is smaller than an area of the field admission opening or the field admission window of the chamber.

In both cases, gas injection pipes still traverse the magnetic core 38. In the central portion of the core, the core forms an electrostatic screen between the pipes and the winding, as already explained above.

In all the embodiments described above, pipes 42, 43, 44, 45, 142 and 144, are schematically represented as having the same diameter. They can also have different diameters for facilitating gas flow control. More gas is injected in regions where pipes have a larger diameter than in regions where they have a comparatively smaller diameter.

The present invention, in any of its aspects, can be implemented in a wide variety of applications such as:
etching;
plasma enhanced or plasma assisted chemical vapour deposition (respectively PECVD or PACVD);
cleaning and surface preparation of workpieces;
passivation; and
plasma ion implantation.

What is claimed is:

1. An apparatus for generating a time-varying, magnetic field in a plasma processing chamber (20) to create or sustain a plasma within the chamber by inductive coupling, comprising:
    a magnetic core (38; 138) presenting a pole face (38a; 39a)
    an inductor (40) associated with the magnetic core arranged to generate a time-varying magnetic field throughout the pole face,
    injector apparatus (42,43,44,45,48,49,51,91,93,95,142, 144) arranged to inject gas into said chamber (20) and through said magnetic core.

2. The apparatus according to claim 1, wherein said injector apparatus forms a showerhead-like gas injection (52, 54).

3. The apparatus according to claim 1 wherein said injector apparatus comprises a plurality of injection pipes (42, 43, 44, 45,142, 144) distributed or disposed through the magnetic core.

4. The apparatus according to claim 3, wherein said pipes are connected to gas distributing apparatus (48, 48a, 48b, 49, 51, 91, 93, 95) arranged to distribute gas to the injection pipes.

5. The apparatus according to claim 4, said gas distributing apparatus being located on the side of the magnetic core opposite to an inner space (50) of said plasma processing chamber (20).

6. The apparatus according to claim 4, said gas distributing apparatus comprising a common gas distributing pipe (48, 48a, 48b, 49), through which gas is distributed to the injection pipes.

7. The apparatus according to claim 4, said gas distributing apparatus comprising a cover (91), located on the side of the magnetic core opposite to an inner space (50) of said plasma processing chamber (20), with a gap (93) between said cover and said magnetic core, said injection pipes (42, 44) being open in said gap.

8. The apparatus according to claim 3, said injection pipes being made of a material selected from the group consisting of stainless steel and an insulating material.

9. The apparatus according to claim 3, said injection pipes having different diameters from each other.

10. A plasma processing apparatus comprising:
    a plasma processing chamber (20) having at least one field admission window (122, 122a, 122b),
    at least one magnetic field generating apparatus according to claim 3, arranged to create a time-varying magnetic field in the chamber by inductive coupling through a corresponding field admission window, each of said injection pipes traversing said window through a corresponding hole in said window, and an end of each of said injection pipes being welded to the periphery of said corresponding hole,
    a power source (60) arranged to drive the magnetic field generating apparatus.

11. The apparatus according to claim 10, further comprising a workpiece support (38, 40; 142) adapted to hold at least one workpiece (26) at portions outside surfaces of the workpiece(s) to be exposed to an energy field from the two or more field admission windows (122a, 122b).

12. The apparatus according to claim 11, wherein the workpiece support (38, 40; 142) is adapted to hold at least one workpiece (26) at edge portions thereof.

13. The apparatus according to claim 1, said pole face (38a) being curved.

14. The apparatus according to claim 1, wherein the pole face (38) is constituted by a single pole face (38a) of unitary construction.

15. The apparatus according to claim 1, wherein the pole face (38) is divided into two or more pole faces that confront respective portions of the plasma processing chamber.

16. The apparatus according to claim 15, wherein the divided pole faces are associated to respective inductors and power supplies whilst being kept in phase to ensure that all the pole faces have the same polarity at any one time.

17. The apparatus according to claim 15, wherein the divided pole faces physically depend from a common magnetic core and inductor.

18. The apparatus according to claim 1, wherein the pole face (38a) constitutes an end face of the magnetic core (38).

19. The apparatus according to claim 1, wherein the magnetic core comprises at least one discontinuity (37) so as to prevent the circulation of eddy currents around the core.

20. The apparatus according to claim 19, wherein the discontinuity is in the form of one or more laminations (37).

21. The apparatus according to claim 20, wherein the lamination(s) (37) extend(s) radially from a point proximal to or at the centre of the core (38) to the periphery of the core.

22. The apparatus according to claim 1, wherein said core (38) has a unitary structure.

23. The apparatus according to claim 1, wherein the inductor (40) comprises a conductor arranged to form one or more turns around at least a portion of the magnetic core (38).

24. The apparatus according to claim 1, wherein the inductor (40) is wound around the periphery of the magnetic core (38).

25. The apparatus according to claim 1, wherein the inductor (40) comprises a planar winding recessed within a groove (47) or groove pattern (46) formed in the magnetic core, on the pole face (38a; 39a).

26. The apparatus according to claim 1, wherein the inductor (40) is driven by a power supply (61) delivering power at a frequency of around 10 kHz to 100 MHz, preferably at a frequency of 13.56 MHz.

27. The apparatus according to claim 1, further comprising biasing apparatus arranged to bias the core with at least one bias selected from the group consisting of: an ac bias (including radio frequencies), a dc bias, and a ground bias.

28. The apparatus according to claim 1, further comprising cooling apparatus arranged to cool the core (26).

29. A plasma processing apparatus comprising:
   a plasma processing chamber (20) having at least one field admission opening (94a, 94b),
   at least one magnetic field generating apparatus according to claim 1, arranged to create a time-varying magnetic field in the chamber,
   a power source arranged to drive the magnetic field generating apparatus.

30. The apparatus according to claim 29, further comprising a barrier (80, 80a; 80b) formed between a field emission surface and the plasma environment arranged so as to prevent that surface from contaminating the chamber (20).

31. The apparatus according to claim 30, said barrier comprising a sheet of dielectric material (80, 80a; 80b) maintained between said pole face structure and an inner space of said plasma processing chamber(20).

32. The apparatus according to claim 31, a distance between said sheet of dielectric material and said face structure being less than 1 mm.

33. The apparatus according to claim 30, wherein the barrier (80) is mounted without contacting a field emission face of the magnetic field generating apparatus, the barrier being held at one of the periphery of the field emission face and the process chamber (20).

34. The apparatus according to claim 33 wherein a pressure adjuster is provided to balance the pressure conditions between the inner and outer faces of the barrier (80).

35. The apparatus according to claim 34, wherein the pressure adjuster comprises a valve arrangement arranged and operative to allow the pressure at the outer face of the barrier (80) to follow that of the process chamber (20) when the latter is submitted to changing pressure conditions, for example, during vacuum pumping or gas admission, or setting to atmospheric pressure for loading and unloading a workpiece, and to seal off the space above the outer surface of surface of the barrier when the chamber is operative for plasma processing such that no contaminant from the energy field generator can reach the plasma environment of the process chamber.

36. The Apparatus according to claim 29, said magnetic core or said pole face having an active field emission area whose size and shape matches or substantially matches the field admission opening or the field admission window.

37. The apparatus according to claim 29, one of said magnetic core and said pole face having an active field emission area whose size and shape is smaller than an area of the field admission opening or the field admission window.

38. The apparatus according to claim 29, further comprising at least one field admission window (122) between an inner space (50) of said plasma chamber and said magnetic field generating apparatus.

39. The apparatus according to claim 38, said magnetic core presenting a face being adapted to be applied against or in proximity to the window (122).

40. The apparatus according to claim 38, said inductive type plasma processing chamber (20) having two or more windows (122a, 122b) for receiving induced field energy, each window enabling induced field energy to enter the chamber from a respective direction.

41. The apparatus according to claim 40, provided with at least one pair of oppositely-facing windows (122a, 122b).

42. The apparatus according to claim 38, further comprising one or more partitions to isolate spaces therein associated with one or a group of windows (122a, 122b).

43. The apparatus according to claim 38, wherein the windows (122a, 122b) are non planar to follow a contour of a wall portion from which they depend.

44. A plasma processing apparatus comprising:
   a plasma processing chamber (20) having at least one field admission window (122),
   at least one magnetic field generating apparatus according to claim 1, arranged to create a time-varying magnetic field in the chamber by inductive coupling through a corresponding field admission window, said injector apparatus and through said magnetic core traversing said window,
   a power source (61) arranged to drive the magnetic field generating apparatus.

45. Use of a plasma processing chamber according to claim 1 for processing a workpiece (16).

* * * * *